US008912443B2

(12) United States Patent
Akahori et al.

(10) Patent No.: US 8,912,443 B2
(45) Date of Patent: Dec. 16, 2014

(54) BUS BAR MOUNTING ASSEMBLY

(75) Inventors: Masahiro Akahori, Shizuoka (JP); Takao Nogaki, Shizuoka (JP); Toshinori Iwai, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 302 days.

(21) Appl. No.: 12/385,185

(22) Filed: Apr. 1, 2009

(65) Prior Publication Data

US 2009/0250237 A1 Oct. 8, 2009

(30) Foreign Application Priority Data

Apr. 3, 2008 (JP) ................................ 2008-097415

(51) Int. Cl.

| | |
|---|---|
| ***H02G 5/00*** | (2006.01) |
| ***H01R 13/46*** | (2006.01) |
| ***H02G 3/18*** | (2006.01) |
| ***H02B 1/20*** | (2006.01) |
| ***H01R 12/00*** | (2006.01) |
| ***H05K 1/00*** | (2006.01) |
| ***H01R 13/68*** | (2011.01) |
| ***H01R 9/22*** | (2006.01) |
| *H01R 9/16* | (2006.01) |

(52) U.S. Cl.
CPC . *H01R 9/226* (2013.01); *H01R 9/16* (2013.01)
USPC ........... 174/68.2; 174/59; 174/70 B; 361/611; 361/637; 439/76.2; 439/620.29

(58) Field of Classification Search
CPC ............... H01R 12/523; H01R 12/585; H01R 12/7023; H01R 12/7064; H01R 9/092; H01R 13/5045; H01R 23/7057
USPC ........ 174/16.2, 17 R, 68.2, 70 B, 71 B, 72 B, 174/88 B, 50, 99 B, 129 B, 133 B, 149 B, 174/158 R, 59; 361/611, 637, 639; 439/76.2, 148, 813, 620.26, 620.29, 439/82, 516, 532, 567, 571; 411/508
See application file for complete search history.

(56) References Cited

U.S. PATENT DOCUMENTS 2,836,215 A * 5/1958 Rapata ...................... 174/158 R
3,044,165 A * 7/1962 Munse ............................ 72/333

(Continued)

FOREIGN PATENT DOCUMENTS

CN 1462696 A 12/2003
JP 54-150694 A 11/1979

(Continued)

OTHER PUBLICATIONS

Office Action issued Sep. 18, 2012 in Japanese Application No. 2008-097415, with English translation.

(Continued)

*Primary Examiner* — Chau N Nguyen
*Assistant Examiner* — Roshn Varghese
(74) *Attorney, Agent, or Firm* — Edwards Wildman Palmer LLP

(57) ABSTRACT

The present invention is intended to provide a novel assembly for properly or accurately mounting the terminal portion of the bus bar on the terminal-accommodating portion of a body for an electric junction box without doing any harm to an electrical conduit(s) which is disposed within the electric junction box. An assembly for mounting a bus bar (1) to a body (12) for an electric junction box, comprises a hole (9) disposed in the bus bar (1), and having a burr (31) created during the hole punching process; and a projection (21) formed in the body (12), and suited for being press-fit into the hole (9), wherein the projection (21) extends beyond the burr after being press-fit into the hole (9). In this configuration, the hole (9) may serve as a basis for position determination of each terminal portion (3, 4) of the bus bar (1), and the projection (21) may serve as a basis for position determination of each terminal-accommodating portion (25) of the body (12). A pair of the holes (9) may be spaced apart from each other in a longitudinal direction of the bus bar (1), and a pair of the projections (21) may be correspondingly formed in the body (12) so as to be press-fit into the holes (9). The projection (21) may have a plurality of press-fit ribs (29) extending outwardly from a peripheral surface thereof, and being approximately triangular in traverse cross-section.

6 Claims, 4 Drawing Sheets

(56) References Cited

U.S. PATENT DOCUMENTS

| | | | | |
|---|---|---|---|---|
| 4,344,717 | A * | 8/1982 | Merz | 403/14 |
| 4,585,285 | A * | 4/1986 | Martens | 439/62 |
| 5,334,047 | A * | 8/1994 | Lutsky | 439/572 |
| 5,336,110 | A * | 8/1994 | Mosquera | 439/572 |
| 5,366,389 | A * | 11/1994 | Kreutter | 439/571 |
| 5,434,749 | A * | 7/1995 | Nakayama | 439/949 |
| 5,716,161 | A * | 2/1998 | Moore et al. | 411/508 |
| 6,139,362 | A * | 10/2000 | Brown | 439/567 |
| 6,354,574 | B1 * | 3/2002 | Oliver et al. | 267/49 |
| 6,699,067 | B1 * | 3/2004 | Zhao et al. | 439/516 |
| 6,747,209 | B2 * | 6/2004 | Uchida et al. | 174/68.1 |
| 6,913,484 | B2 * | 7/2005 | Soga et al. | 439/516 |
| 7,019,215 | B2 * | 3/2006 | Arai | 174/72 A |
| 7,036,779 | B2 * | 5/2006 | Kawaguchi et al. | 174/135 |
| 7,179,990 | B2 * | 2/2007 | Kanazawa | 174/50 |
| 7,232,950 | B2 * | 6/2007 | Kaneko et al. | 174/50 |
| 7,394,018 | B2 * | 7/2008 | Saka et al. | 174/50 |
| 7,510,411 | B2 * | 3/2009 | Wu et al. | 439/135 |
| 2003/0059278 | A1 * | 3/2003 | Kochiya | 411/508 |
| 2005/0280288 | A1 * | 12/2005 | Suzuki et al. | 296/208 |
| 2007/0026729 | A1 * | 2/2007 | Ochiai et al. | 439/516 |
| 2007/0270019 | A1 * | 11/2007 | Yamaguchi et al. | 439/404 |

FOREIGN PATENT DOCUMENTS

| | | |
|---|---|---|
| JP | 64-054716 U | 4/1989 |
| JP | 2006-050827 | 2/2006 |

OTHER PUBLICATIONS

Notification of the Second Office Action for Chinese Patent Application No. 200910138783.9 issued Mar. 31, 2013 (with English translation).

Notification of the First Office Action for Chinese Patent Application No. 200910138783.9 issued May 25, 2011.

* cited by examiner

BUS BAR MOUNTING ASSEMBLY

CROSS-REFERENCE TO RELATED APPLICATIONS

The present Application claims priority to Japanese Patent Application No. 2008-097415 filed Apr. 3, 2008, the entire disclosure of which is expressly incorporated herein by reference.

BACKGROUND OF THE INVENTION

1. Field of the Invention

The present invention relates to an assembly for mounting a bus bar which is required for fuse connection in an electric junction box, more specifically, a hole-and-projection assembly.

2. Description of the Related Art

FIGS. 8A and 8B show a typical conventional assembly for mounting a bus bar on an electric junction box. The shown assembly is specifically disclosed in Japanese Publication of Patent Application No. 2006-50827 (Refer to FIGS. 1 to 3).

The conventional assembly shown in FIGS. 8A and 8B is directed to a wiring board 51 of a bus bar 53 which is to be received in an electric junction box. In this wiring board 51, there are provided a projection 54 and a cross wall (also referred as a "barrier") 55, both of which are formed in an insulating polymeric substrate 52 of the wiring board 51. The bus bar 53 has a small-sized hole 56 disposed therein and configured to engage the projection 54. A widened portion 55*a* is formed in the area of the cross wall 55 with being spaced apart from the projection 54. The lateral end portion of the bus bar 53 which is received within the cross wall 55 is made to abut the widened portion 55*a*. The projection 54 passing through the hole 56 is heated and melted in its tip portion 54*a* so that the bus bar 53 can be prevented from any float inside a space between the projection 54 and the widened portion 55*a*. The bus bar 53 is obtained by the process of using a punch press to push a punch through a metallic plate and into a die having a desired shape.

As stated above, the conventional assembly is only directed to the wiring board 51 for the bus bar. However, in a case where the bus bar is intended to be directly mounted on the insulating polymeric body for the electric junction box, a burr that is generally created during the formation of the pilot hole for the bus bar often damages an electrical conduit wire(s) arranged in the electric junction box. Another problem occurs when a relatively long bus bar is employed. In this case, there is possible displacement between each terminal of the bus bar and each terminal-accommodating portion of the body (i.e. the electric junction box).

To overcome the afore-mentioned problems, there is provided a novel assembly for properly or accurately mounting a terminal portion disposed in a bus bar to a terminal-accommodating portion disposed in a body for an electric junction box, without doing any harm to an electrical conduit(s) which may be disposed within the electric junction box.

SUMMARY OF THE INVENTION

In accordance with the first aspect of the invention, there is provided an assembly for mounting a bus bar to a body for an electric junction box. The assembly includes a hole disposed in the bus bar, and having a burr created during the hole punching process, and a projection formed in the body, and suited for being press-fit into the hole. In this configuration, the projection extends beyond the burr after being press-fit into the hole.

In accordance with the second aspect of the invention, in the assembly the hole may serve as a basis for position determination of each terminal portion of the bus bar, and the projection may serve as a basis for position determination of each terminal-accommodating portion of the body.

In accordance with the third aspect of the invention, in the assembly a pair of the holes may be spaced apart from each other in a longitudinal direction of the bus bar, and a pair of the projections may be correspondingly formed in the body so as to be press-fit into the holes.

In accordance with the fourth aspect of the invention, in the assembly the projection may have a plurality of press-fit ribs extending outwardly from a peripheral surface thereof and being approximately triangular in traverse cross-section. In this configuration, the rib formed on the peripheral surface of the projection can be smoothly press-fit into the inner space of the hole with ease. In this case, friction resistance is greatly decreased. The rib may have a narrow width.

DETAILED DESCRIPTION OF THE INVENTION

FIGS. 1 to 7 each show one embodiment of an assembly for mounting a bus bar to the body for an electric junction box, in accordance with the present invention.

Figure 1:
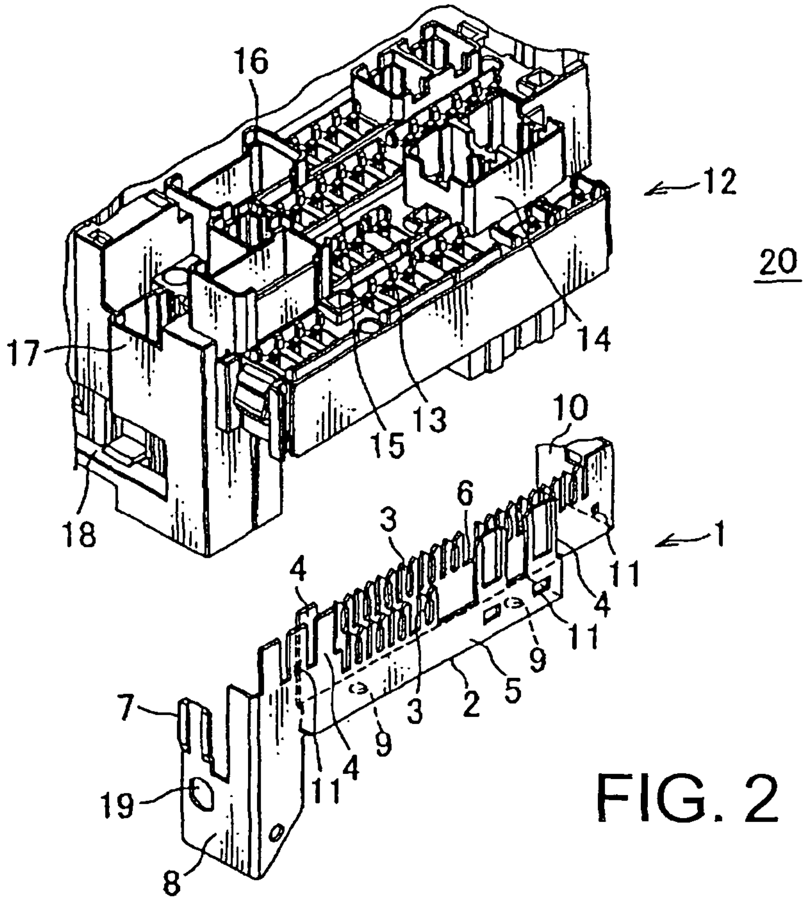
FIG. 1 is an exploded perspective view showing one embodiment of an assembly for mounting a bus bar on (relative to) the body of an electric junction box, in accordance with the present invention.
Figure 2:
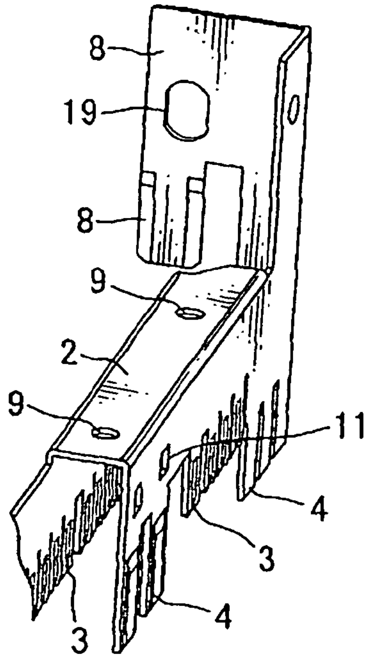
FIG. 2 is a perspective view of one embodiment of the bus bar in accordance with the present invention, as viewed from the bottom (i.e., upside-down).

Referring first to FIGS. 1 and 2, a bus bar 1 is shown to include a horizontally-elongated base portion 2, a pair of vertically-extending lateral plates 5 and 6 each having a picking terminal portion 3 for fuse connection and a tab terminal portion 4 for connector connection. In one example, a pair of the lateral plates 5 and 6 approximately vertically extends from each of opposing edges of the base portion 2. In this configuration, a pair of the lateral plates 5 and 6 is integrally formed with the base portion 2. An approximately L-shaped plate portion 8 that has a tub terminal 7 for power supply is formed on the anterior of the lateral plate 5 in an integrated manner.

A pair of pilot holes (also referred as “holes”) 9 is disposed in an approximate center area (i.e., middle area) in the across-the-width direction of the base portion 2, with being spaced apart from each other in a longitudinal direction of the base portion 2. A pair of the holes 9 generally results from the preparation or formation of the bus bar. More specifically, the bus bar 1 may be stamped out from electrically conductive metallic plate, for example, by use of an upper and lower die (now shown). In this case, the hole 9 is formed as a positioning means. The metallic plate is folded so as to form a pair of the lateral plates 5 and 6, and an approximately L-shaped plate portion 8. As a result, a final bus bar product may be produced. The other lateral plate 6 may be provided with another plate portion 10 for booster cable connection when battery is power off. This plate portion 10 may be integrally formed with the lateral plate 6. In the bottom of the tub terminal 4, there is provided a engaging hole 11 enabling a compliant locking lance (not shown) of the body 12 to insert thereinto.

As shown in FIG. 1, the bus bar 1 is upwardly mounted or assembled to the insulating polymeric body 12 for the electric junction box 20. As shown in FIG. 1, the terminals 3 and 4 for one lateral plate portion 5 are respectively accommodated in a second fuse-mounting portion 13 from the right and a connector housing 14, and the terminals 3 and 4 for the other lateral plate portion 6 are respectively accommodated in a third fuse-mounting portion 15 from the right and a connector housing 16.

Other bus bar(s) (not shown) is also accommodated and arranged parallel to and adjacent to the afore-mentioned bus bar. More specifically, other bus bar(s) is also disposed outside and downstream each lateral plate portions 5 and 6. A plate-shaped fuse (not shown) is connected to the picking terminal 3 for the bus bar 1 via one tub terminal, and is connected to the picking terminal for other downstream bus bar via the other tub terminal. The downstream bus bar is connected to a load side. In this specification, “downstream” may be determined on the basis of the direction of current.

The tub terminal 7 disposed in the front end portion is accommodated within an anterior connector housing 17 of the body 12. A terminal which is located upstream a high-current fusible link (not shown) is connected to a hole 19 disposed in the approximately L-shaped plate portion 8 by use of bolt and the like. In this configuration, the fusible link can be present in an opening 18 disposed in the front end portion of the body 12.

However, throughout the specification and claims, the term(s) with respect to the direction is not absolute, but is only selected for helping one to understand.

Figure 3:
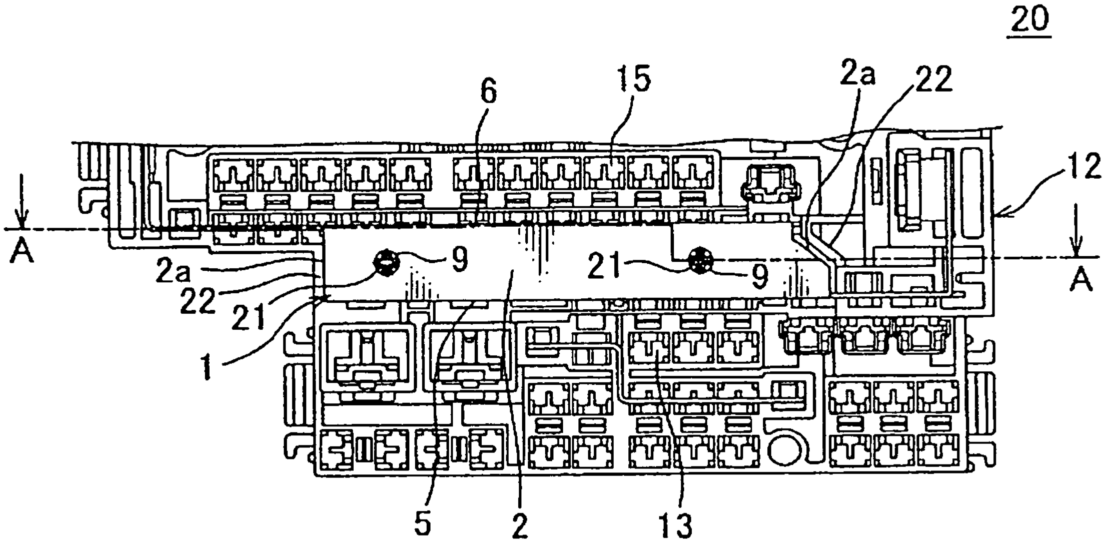
FIG. 3 is a planar view (a bottom view) for the illustration of an assembly for mounting the bus bar to the body of an electric junction box, in accordance with the present invention.
Figure 4:
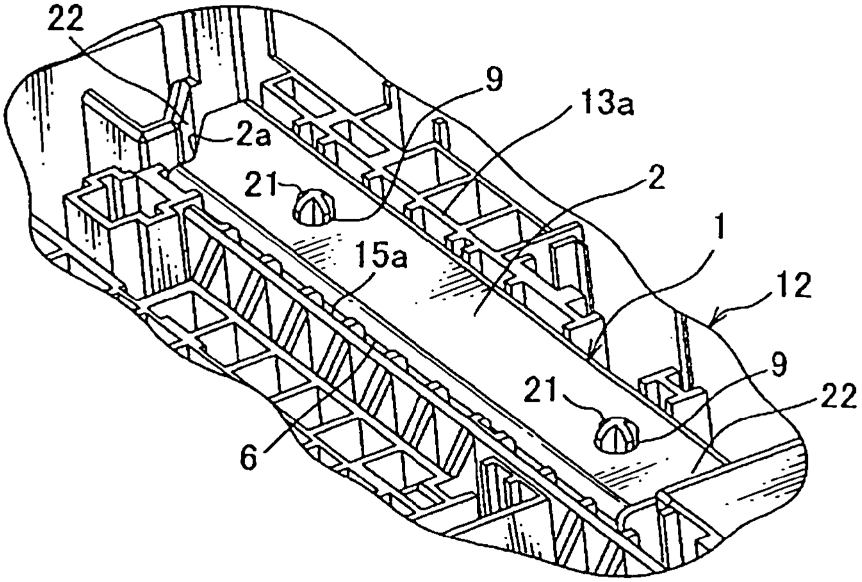
FIG. 4 is a perspective view for the illustration of an assembly for mounting the bus bar to the body of an electric junction box, in accordance with the present invention.

Each of FIGS. 3 and 4 is a view for the illustration of the state in which the bus bar 1 is assembled or mounted to the body 12 for the electric junction box 20. FIGS. 3 and 4 are respectively viewed from the bottom of the electric junction box 20. In FIGS. 3 and 4, anteroposterior position is approximately inverted.

When a pair of boss-shaped projections 21 disposed in the body 12 for the electric junction box 20 engages a pair of the holes 9 disposed in a longitudinal direction of the base portion 2 of the bus bar 1, the bus bar 1 can be properly or accurately positioned or disposed relative to the body 12 for the electric junction box 20. Referring now to FIG. 4, the lower end portions 13*a* and 15*a* of the fuse-mounting portions 13 and 15 are substantially equal to each other in their height, and are respectively disposed adjacent the both opposing ends (i.e. the right end side and the left end side) of the base portion 2. In other words, the lower end portion 13*a* is disposed adjacent to one face of the base portion 2, and the lower end portion 15*a* is disposed adjacent to the opposite face of the base portion 2. A wall portion 22 of the body 12 for the electric junction box 20 is disposed adjacent to an anterioposterior edge portion 2*a* of the base portion 2, and is made higher than the edge portion 2*a* to a certain extent. As such, in the area of the anterioposterior edge portion 2*a*, the electrical conduit (not shown) being present inside the electric junction box 20 can be secure from any damage.

Figure 5:
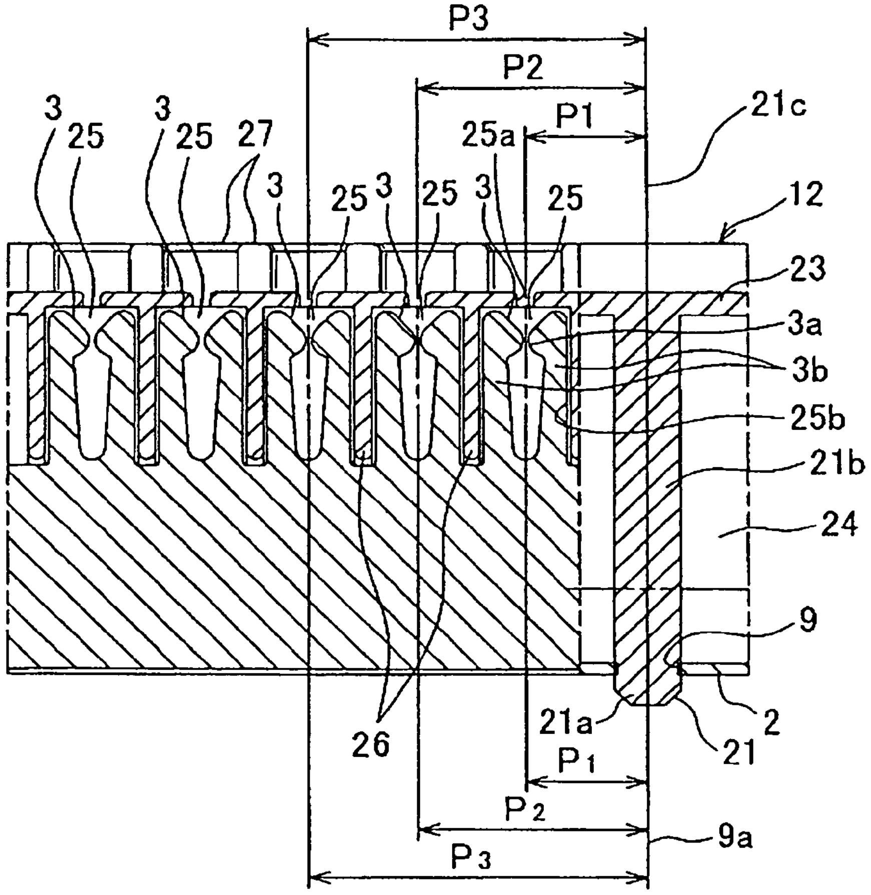
FIG. 5 is a cross-sectional view taken along line A-A in FIG. 3 FIGS. 6A and 6B are respectively provided to illustrate the state that a projection of the body for an electric junction box engages a hole disposed in a bus bar. In particular.

As shown in FIG. 5, the projection 21 which passes through and engages the hole 9 disposed in the base portion 2 of the bus bar 1 axially extends and at the same time is orthogonally oriented to the upper wall 23 of the body 12 for the electric junction box 20. The tip portion 21*a* of the projection 21 engages the hole 9. A column 21*b* of the projection 21 is preferably supported by the body 12 for the electric junction box 20 in the area of a lateral rib 30. In this configuration, the lateral rib 30 leads into a slit-like, vertically-notched groove (not shown) disposed in the lateral plate portions 5 and 6.

There is provided a space 24 between the base portion 2 of the bus bar 1 and the upper wall 23 of the body 12 for the electric junction box 20. Each picking terminal 3 of the lateral plate portions 5 and 6 of the bus bar 1 is received in each terminal-accommodating portion 25 disposed in the body 12 of the electric junction box 20. Furthermore, in a case where the projection 21 is formed perpendicularly to an intermediate wall (now shown) in place of the upper wall 23, the space between the base portion 2 and the intermediate wall can be made smaller than the space 24 as depicted in FIG. 5, and the projection 21 may be also made shorter than the projection 21 as depicted in FIG. 5.

The upper wall 23 has a slit-like opening 25*a* for the terminal-accommodating portion 25. The opening 25*a* communicates with a space for accommodation 25*b* which is sectioned by a vertical and short cross wall 26. Each of the picking terminals 3 is received in each of the spaces for accommodation 25*b*. The cross wall 26 extends into a gap (also referred as a “clearance”) 3*a* between the picking terminals 3. A pair of electric contact pieces 3*b* of the picking terminal 3 is elastically deformed for an opening position within the area of the space 25*b*, when the tub terminal of the fuse (not shown) is inserted thereto. The body of the fuse is received in a rectangular peripheral wall 27 disposed on the upper wall 23.

Referring to FIG. 5, based on a shaft center 21*c* of one projection 21, the pitch of the terminal-accommodating portion 25 of the body 12 is set to P1, P2, P3, . . . , Pn, and based on the center 9*a* of the associated hole 9 engaging the afore-mentioned projection 21, the pitch of the picking terminal 3 is set to $P_1$, $P_2$, $P_3$, . . . , $P_n$. Therefore, in a case where the projection 21 is generally press-fit into the hole 9, the pitch P of each terminal-accommodating portion 3 would correspond to the pitch P of each picking terminal 3, and each picking terminal 3 can be thus properly or accurately received in each terminal-accommodating portion 25 without any displacement therebetween.

In a case where one of a pair of the projections 21 is press-fit into one of a pair of the holes 9, the other projection 21 may or may not be press-fit into the other hole 9. In other words, the other projection 21 may lead into the associated hole 9 with being spaced from the inner face of the hole 9. Furthermore, not a pair of the projections 21 but a single projection 21 can be also employed in accordance with the present invention.

Figure 6A:
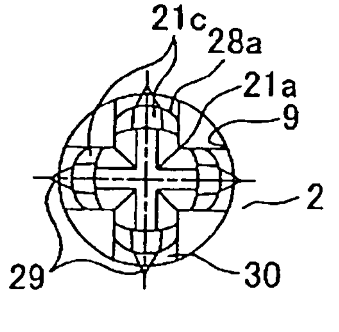
FIG. 6A is a planar view.
Figure 6B:
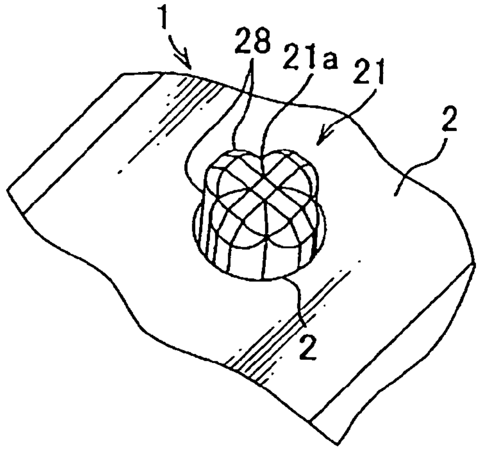
FIG. 6B is a perspective view.

Referring to FIGS. 6A and 6B, there is provided one example of the tip portion 21*a* of the projection 21. In a planar view, each rib-shaped portion 28 is shown to extend in each of four directions to form a cross-shape. In this configuration, one rib-shaped portion 28 is made at about 90 degrees relative to adjacent other rib-shaped portion 28. A small-sized rib 29 is approximately triangular in traverse cross-section and is integrally formed with the area of the tip portion of the peripheral arc face 28*a* of each rib-shaped portion 28. This small-sized rib 29 can be also referred as a "triangular rib" throughout the specification. In this configuration, the tip portion of the triangular rib 29 is to be press-fit into the hole 9 disposed in the bus bar 1. FIGS. 6A and 5 show the initial geometry of a triangular rib 29. In this context, the initial geometry generally means the shape or geometry of the triangular rib 29 which is not press-fit into the hole. The rib 29 may have a triangular cross-section, and is axially orientated in the area of the tip portion of the projection 21. Referring to FIG. 6A, in the area of edge portion 2*a* of the base portion 2, a reinforcing rib 30 extends outwardly from the peripheral surface of the rib-shaped portion 28 inside the hole 9 (i.e. inside the bus bar 1). The reinforcing rib 30 is integrally formed with the rib-shaped portion 28.

As not entire circumference (i.e., entire perimeter) but for example four triangular ribs 29 are to be press fit into the hole 9, press-in force to be needed can be greatly decreased. Furthermore, if any displacement between a pair of the projections 21 and a pair of the holes 9 occurred, due to the configuration of the triangular rib 29, more specifically, due to compression deformation and the compliance of the triangular rib 29, the displacement, if any, could be greatly moderated or completely eliminated. Accordingly, the projection 21 can be press-fit into the hole with ease. If there occurred no displacement therebetween, the four triangular ribs 29 would be uniformly or regularly subjected to compression deformation, and the center of the hole 9 would be accurately or precisely aligned with that of the projection 21. As a result, the picking terminal 3 and the terminal-accommodating portion 25 can be accurately or precisely arranged in a desired position. The position relationship between the picking terminal 3 and the terminal-accommodating portion 25 is shown in FIG. 5.

Figure 7:
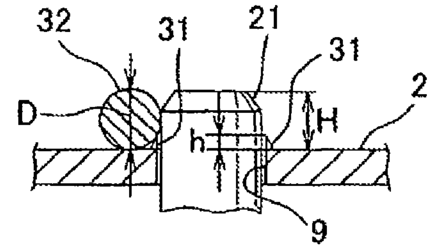
FIG. 7 is a longitudinal sectional view for illustrating the state that an electrical conduit(s) is secure from any impedance induced by the burr formed in the vicinity of a hole.
Figure 8A:
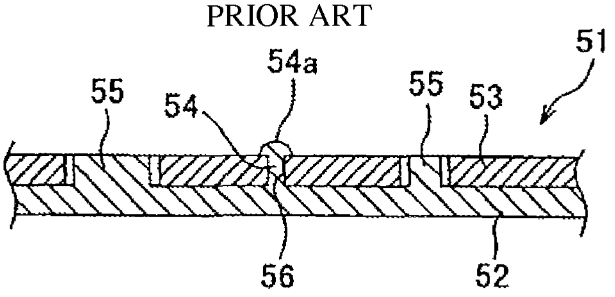
FIG. 8A PRIOR ART
FIGS. 8A and 8B respectively show a conventional assembly for mounting a bus bar to the body of an electric junction box.
Figure 8B:
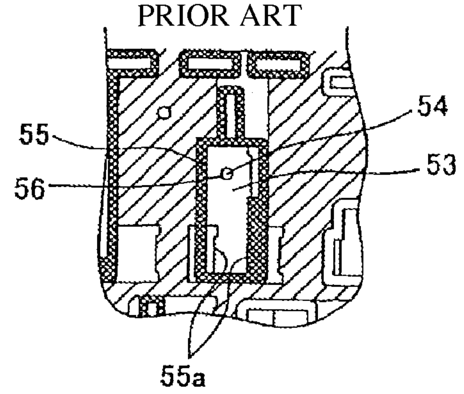
FIG. 8B PRIOR ART

As shown in FIG. 7, even if any burr 31 may be created on the outer face of the base portion 2 during punching process of the hole 9 of the bus bar 1, the height from the base portion 2 to the tip portion of the projection 21 (hereinafter, the height can be referred to "H".) should be designed or set to be greater than the height of the burr 31 (hereinafter, the height can be referred to "h".). Briefly speaking, projection 21 extends beyond the burr after being press-fit into the hole 9. Therefore, the electrical conduit 32 becomes in contact with the projection 21. Alternatively, the electrical conduit 32 becomes in contact with both the projection 21 and the base portion 2. Accordingly, the electrical conduit 32 is prevented from direct contact with the burr 31, and thus is never adversely affected by the burr 31. Preferably, the height (H) of the projection 21 is designed to be equal to or slightly greater than the diameter of the electrical conduit 32.

The electrical conduit 32 includes, but is not limited to, the electrical conduit of the picking terminal of the bus bar 1, the electrical conduit of a terminal received in the terminal-accommodating portion 25 (refer to FIG. 3), and the electrical conduit of the terminal received in the connector housings 14 and 16 (refer to FIG. 1). In this embodiment, the body 12 may be accommodated inside a frame (not shown) made of synthetic polymer and having upper and lower openings, and a synthetic polymeric cover (not shown) is applied or mounted to the frame via the upper and lower openings. Generally, the electric junction box 20 is designated to the aforementioned configuration. In other words, the electric junction box 20 is generally a concept having a body, a frame, and a cover for frame. However, the electrical junction box 20 may be also constituted by elements such as the bus bar 1, fuse, and so on.

Several advantages with respect to the present invention will be hereinafter described.

In accordance with the first aspect of the invention, the electric conduit(s) of the terminal which is accommodated in the body for the electric junction box or in the connector housing of the body for the electric junction box becomes in contact with the projection, the projection being formed in the body for electric junction box and passing through the hole disposed in the bus bar. Accordingly, the electrical conduit is hardly or never subject to damage caused by the burr, which is present in the vicinity of the hole. Therefore, the electric conduit can be prevented from being damaged mainly due to the burr. Simultaneously, the reliability of the electric connection can be greatly enhanced inside the electric junction box.

In accordance with the second aspect of the invention, since the pitch of each terminal of the bus bar and the pitch of each terminal-accommodating portion matches together, each terminal can be securely or accurately received in the corresponding terminal-accommodating portion without any displacement. Therefore, the terminal of fuse, relay, and connector can be securely or accurately connected to the terminal portion. Accordingly, the reliability of the electric connection of the electric junction box can be surprisingly improved.

In accordance with the third aspect of the invention, any displacement between the projection formed in the body and the hole disposed in the bus bar can be avoided. For reference, the displacement conventionally occurs in an orthogonal direction relative to the longitudinal direction of the bus bar. Accordingly, the reliability of electric connection between the terminal of the bus bar and the terminal of the fuse or connector can be greatly enhanced.

In accordance with the fourth aspect of the invention, the rib forces the projection to securely press-fit into the hole, and the bus bar can be thus easily and firmly mounted to the body for the electric junction box. Furthermore, even if any displacement between the projection formed in the body and the hole disposed in the bus bar occurs, the rib can substantially eliminate such a displacement. Accordingly, the bus bar can be easily and securely mounted or fixed to the body for the electric junction box.

The above embodiments and examples are given to illustrate the scope and spirit of the instant invention. These embodiments and examples will make apparent, to those skilled in the art, other embodiments and examples. These other embodiments and examples are within the contemplation of the present invention. Therefore, the instant invention should be limited only by the appended claims.

The invention claimed is:

1. A bus bar and a body for an electric junction box assembly, comprising:

a hole disposed in the bus bar, and having a burr, the bus bar provided with a base plate; and a projection formed in the body, and suited for being press-fit into the hole, wherein the projection extends beyond the burr when being press-fit into the hole, wherein the body and projection are formed of a same insulative material and integral with each other, and the projection extends from a wall of the body, wherein the projection includes a plurality of press-fit ribs extending outwardly from a peripheral surface thereof, each of the press fit ribs individually having an approximate triangular cross-section which is in parallel with the base plate of the bus bar, the triangular cross-section having one side facing the press-fit rib and two sides not facing the press-fit rib, and wherein each of the press-fit ribs is press fit into the hole such that one corner of the triangular cross-section not facing the projection and two sides of the triangular cross-section not facing the projection are subjected to compression deformation inside the hole, thereby coming in contact with an interior surface of the hole, wherein the bus bar is mounted to the body of the electric junction box via an engagement therebetween and wherein the engagement only depends on the compression deformation.

2. The assembly according to claim 1, wherein the hole serves as a basis for position determination of each terminal portion of the bus bar, and the projection serves as a basis for position determination of each terminal-accommodating portion of the body.

3. The assembly according to claim 1, wherein a pair of the holes is spaced apart from each other in a longitudinal direction of the bus bar, and a pair of the projections is correspondingly formed in the body so as to be press-fit into the holes.

4. The assembly according to claim 1, wherein each rib is disposed at about 90 degrees relative to an adjacent abutting rib to form the projection.

5. A bus bar and a body for an electric junction box assembly, the assembly comprising:

a bus bar including at least a pair of alignment holes disposed apart from one another, and a base plate, the pair of alignment holes serving as a basis for positional determination of each terminal portion of the bus bar and configured to receive at least a pair of corresponding columnar projecting members therein, the pair of columnar projecting members extending from a wall of the insulative body to the bus bar, which is disposed away from the wall, the projecting members serving as a basis for positional determination of each terminal-accommodating portion of the insulative body, wherein each of the pair of columnar projecting members includes a tip portion having a plurality of ribs extending outwardly from a peripheral surface thereof, each of the press fit ribs individually having an approximate triangular cross-section which is in parallel with the base plate of the bus bar, the triangular cross-section having one side facing the press-fit rib and two sides not facing the press-fit rib, wherein the ribs and tip portions are configured for press fitted reception into the alignment holes, and wherein each of the press-fit ribs is press fit into the hole such that one corner of the triangular cross-section not facing the projection and two sides of the triangular cross-section not facing the projection are subjected to compression deformation inside the hole, thereby coming in contact with an interior surface of the hole, wherein the bus bar is mounted to the body of the electric junction box via an engagement therebetween and wherein the engagement only depends on the compression deformation.

6. A bus bar and a body for an electric junction box assembly, comprising:

a hole disposed in the bus bar, and having a burr, the bus bar provided with a base plate; and a projection formed in the body, and suited for being press-fit into the hole, wherein the projection extends beyond the burr when being press-fit into the hole, wherein the body and projection are formed of a same insulative material and integral with each other, and the projection extends from a wall of the body, wherein the projection includes a plurality of press-fit ribs extending outwardly from a peripheral surface thereof, each of the press fit ribs individually having an approximate triangular cross-section which is in parallel with the base plate of the bus bar, the triangular cross-section having one side facing the press-fit rib and two sides not facing the press-fit rib, and wherein each of the press-fit ribs is press fit into the hole such that one corner of the triangular cross-section not facing the projection and two sides of the triangular cross-section not facing the projection are subjected to compression deformation inside the hole, thereby coming in contact with an interior surface of the hole, wherein the bus bar is mounted to the body of the electric junction box, and wherein each rib is disposed at about 90 degrees relative to an adjacent abutting rib to form the projection.

* * * * *